(12) United States Patent
Redlin

(10) Patent No.: US 7,183,928 B2
(45) Date of Patent: Feb. 27, 2007

(54) THERMAL IMAGING PAPER LAMINATE

(75) Inventor: Gregory George Redlin, Sherwood, WI (US)

(73) Assignee: Appleton Papers Inc., Appleton, WI (US)

( * ) Notice: Subject to any disclaimer, the term of this patent is extended or adjusted under 35 U.S.C. 154(b) by 0 days.

(21) Appl. No.: 11/036,042

(22) Filed: Jan. 18, 2005

(65) Prior Publication Data

US 2005/0134464 A1 Jun. 23, 2005

Related U.S. Application Data

(63) Continuation of application No. 10/183,511, filed on Jun. 28, 2002, now Pat. No. 6,937,153.

(51) Int. Cl.
*G08B 13/14* (2006.01)
(52) U.S. Cl. .............. 340/572.8; 340/572.1; 340/572.4; 340/572.7; 340/571; 340/568.1
(58) Field of Classification Search ......... 340/572.8, 340/572.1, 572.4, 572.7, 571, 568.1; 345/55, 345/87; 156/60, 176
See application file for complete search history.

(56) References Cited

U.S. PATENT DOCUMENTS

| | | | |
|---|---|---|---|
| 3,539,375 A | 11/1970 | Baum | |
| 3,674,535 A | 7/1972 | Blose et al. | |
| 3,746,675 A | 7/1973 | Blose et al. | |
| 4,151,748 A | 5/1979 | Baum | |
| 4,181,771 A | 1/1980 | Hanson et al. | |
| 4,246,318 A | 1/1981 | Baum | |
| 4,470,057 A | 9/1984 | Glanz | |
| 4,642,263 A | 2/1987 | Culbertson | |
| 5,821,196 A | 10/1998 | Schulz et al. | |
| 5,982,284 A | 11/1999 | Baldwin et al. | |
| 6,100,804 A | 8/2000 | Brady et al. | |
| 6,147,604 A | 11/2000 | Wiklof et al. | |
| 6,265,977 B1 | 7/2001 | Vega et al. | |
| 6,369,711 B1 * | 4/2002 | Adams et al. | 340/572.1 |
| 6,395,373 B2 * | 5/2002 | Conti et al. | 428/138 |
| 6,404,341 B1 * | 6/2002 | Reid | 340/572.8 |
| 6,951,596 B2 * | 10/2005 | Green et al. | 156/264 |

* cited by examiner

*Primary Examiner*—Hung Nguyen
(74) *Attorney, Agent, or Firm*—Birch, Stewart, Kolasch & Birch, LLP

(57) ABSTRACT

A thermal imaging paper having a laminate structure is disclosed. The laminate structure includes a thermal imaging heat sensitive substrate, an adhesive layer, and a polyfoam layer. In addition, a security feature such as an antenna and integrated circuit are provided in a position interposed between said adhesive layer and said thermal imaging heat sensitive substrate. The thermal imaging paper provides the combination of an effective thermal imaging paper product incorporating the benefits of a security feature such as a wireless memory device.

2 Claims, 4 Drawing Sheets

THERMAL IMAGING PAPER LAMINATE

CROSS-REFERENCES TO RELATED APPLICATIONS

This application is a continuation of U.S. application No. 10/183,511 filed on Jun. 28, 2002, Pat. No. 6,937,153. The entirety of the above-identified application is hereby incorporated by reference.

BACKGROUND OF THE INVENTION

1. Field of the Invention

The present invention relates to a thermal imaging paper and a method of making a thermal imaging paper. In particular, the present invention relates to an thermal imaging laminate structure that includes a thermal imaging layer, an integrated circuit and antenna device, and a cushioning layer.

2. Description of the Background Art

Memory tags or labels for storing and retrieving data in the background art often employ a laminated circuit substrate positioned between a face sheet and a release liner. The memory devices for storing and retrieving data are well known in the related art, and include radio frequency ("RF") tags that are readily available from a number of commercial manufacturers, including Texas Instruments and Phillips.

The face sheet provides a protective layer over one surface of the circuit substrate, thereby protecting the antenna and the electronic structure. A pressure sensitive adhesive may cover a second surface of the circuit substrate to readily affix the memory device to an item or container. The release liner provides a selectively removable layer over the pressure sensitive adhesive, which a user removes before applying the memory tag to an item or container.

The memory device of the background art may include a circuit substrate having an electronic structure such as an integrated circuit, and electrical connections such as traces and pads. For RF tag memory devices, an antenna is coupled to one or more pads of the circuit substrate. The electronic structure typically includes a memory portion and a logic portion. The logic portion controls the reading, writing, or manipulating of data in the memory portion. The logic portion further couples the memory portion to the antenna to form a transmitter, receiver, or transceiver for reading or writing data to or from the RF tag. Thus, for example, an RF tag may receive and transmit RF signals to write data to the memory and to read data from the memory.

U.S. Pat. No. 6,147,604 to Wiklof et al., the entire contents of which are hereby incorporated by reference, further describes the background art relating to wireless memory devices having a circuit substrate positioned within a laminate structure. The device described in the Wiklof et al. patent specifically provides a memory device having a substrate, an antenna formed on a first surface of the substrate, an electronic structure carried by the substrate and coupled to the antenna, a selectively deformable intermediate layer covering the first surface, the antenna and the electronic structure, and an adhesive layer covering the intermediate layer. In addition, the wireless memory device of the Wiklof et al. patent describes the use of a substrate, e.g., a flexible sheet type material having very low conductivity and preferably heat-resistant such as sheet plastic. The intermediate layer may take the form of a foam material, a selectively pressurizable and deformable envelope or other elastomeric material.

The intermediate layer is deformable for selectively positioning the antenna with respect to the adhesive layer, and thereby positioning the antenna with respect to an item or container to which the memory device is secured. The intermediate layer may be compressed, creating a relatively low profile for permitting printing on the memory device. In use, the intermediate layer may be in an uncompressed state, thereby spacing the antenna relatively from the adhesive layer and consequently spacing the antenna from the item or package to which the memory device is secured.

The device of the Wiklof et al. patent is aimed at specifically overcoming a prior art problem relating to the positioning of the wireless memory device's electrical components. If the antenna in an RF tag is too close to the device to which it is installed, unfavorable interference with wireless communications may be experienced, especially when the underlying container is made of metal.

With improvements in wireless memory devices, the necessity of providing a selectively deformable intermediate layer in a laminate structure is not essential for all applications. In addition, the present inventor has determined that the a thermal imaging laminate structure having a memory device and not requiring a selectively deformable intermediate layer can be cost effectively and advantageously employed in a variety of thermal imaging applications. In contrast to the heat resistant substrate of the background art devices such as that described in the Wiklof et al. patent, the present inventor has determined that a heat activated layer can be effectively utilized in conjunction with thermal imaging applications.

SUMMARY OF THE INVENTION

The present invention overcomes the shortcomings associated with the devices and methods of the background art, and achieves other advantages not realized by the background art.

It is an aspect of the present invention to provide a method and apparatus for a thermal imaging laminate structure having a wireless memory device for thermal imaging applications.

One or more of the aspects of the present invention are accomplished by a thermal imaging laminate structure comprising a thermal imaging paper substrate; a foam layer; a wireless memory device, the foam layer and the wireless memory device being disposed along the thermal imaging paper substrate; and an adhesive layer, the wireless memory device being positioned between the thermal imaging paper substrate and the adhesive layer.

One or more of these aspects of the present invention are also accomplished by a thermal imaging system comprising a thermal printing device;

a heat sensitive, thermal imaging paper, the thermal imaging paper having a laminate structure including a thermal imaging paper substrate having a first surface and a second surface, the first surface being positioned to face toward the thermal printing device during a printing process, a cushioning layer, a wireless memory device capable of reflecting RF signals, the cushioning layer and the wireless memory device being disposed along the second surface of the thermal imaging paper substrate, and an adhesive layer, the wireless memory device being positioned between the thermal imaging paper substrate and the adhesive layer; and a detection unit, the detection unit being positioned in the proximity of the wireless memory device to transmit and receive RF signals from the wireless memory device.

One or more of these aspects of the present invention are also accomplished by a thermal imaging laminate structure comprising a thermal imaging paper substrate; a cushioning layer; a wireless memory device, the cushioning layer and the wireless memory device being disposed along the thermal imaging paper substrate; an antistatic coating layer; and an adhesive layer, the wireless memory device being positioned between the thermal imaging paper substrate and the adhesive layer.

One or more of these aspects of the present invention are also accomplished by a RFID product having a thermal imaging laminate structure, the product comprising a thermal imaging paper substrate; a cushioning layer; a wireless memory device, the cushioning layer and the wireless memory device being disposed along the thermal imaging paper substrate; an antistatic coating layer; and an adhesive layer, the wireless memory device being positioned between the thermal imaging paper substrate and the adhesive layer, wherein the product is at least one of a direct thermal label, a thermal transfer label, a direct thermal tag and a thermal transfer thermal tag.

One or more of these aspects of the present invention are also accomplished by a method of producing a thermal printed paper product incorporating the laminate structures and/or system described hereinabove, the method comprising the steps of thermally printing the thermal imaging paper with the thermal printing device; and producing the thermal imaged paper product having the security feature, wherein the security feature includes the wireless device and the thermal imaged paper product includes at least one of a paper sheet, a roll of paper product, a label, and a tag.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

Figure 1:
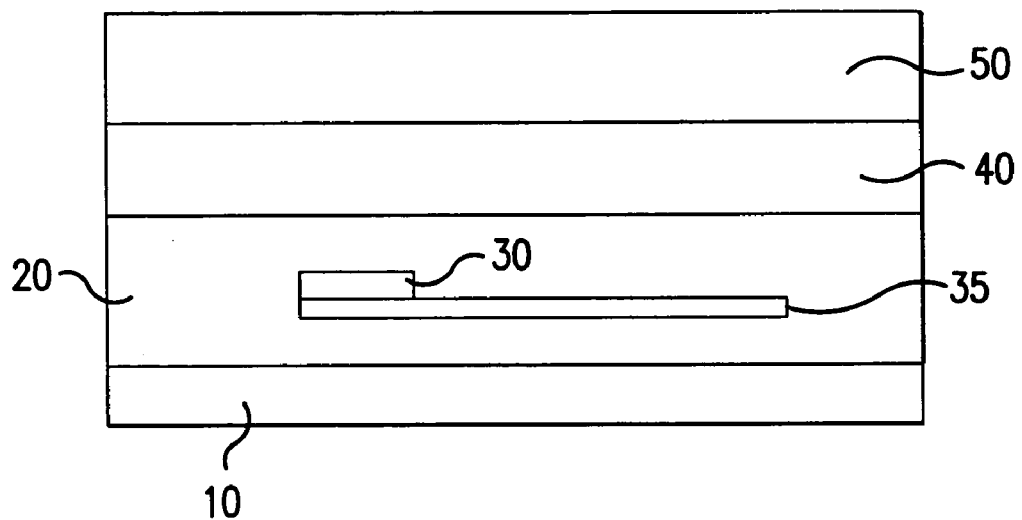
FIG. 1 is a sectional view of a thermal imaging laminate structure according to an embodiment of the present invention.
Figure 2:
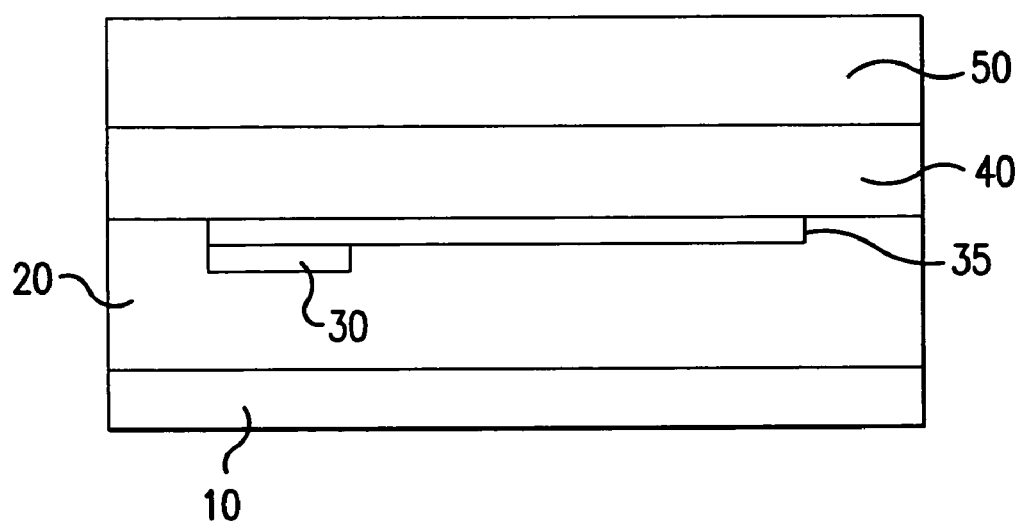
FIG. 2 is a sectional view of a thermal imaging laminate structure according to an embodiment of the present invention.
Figure 3:
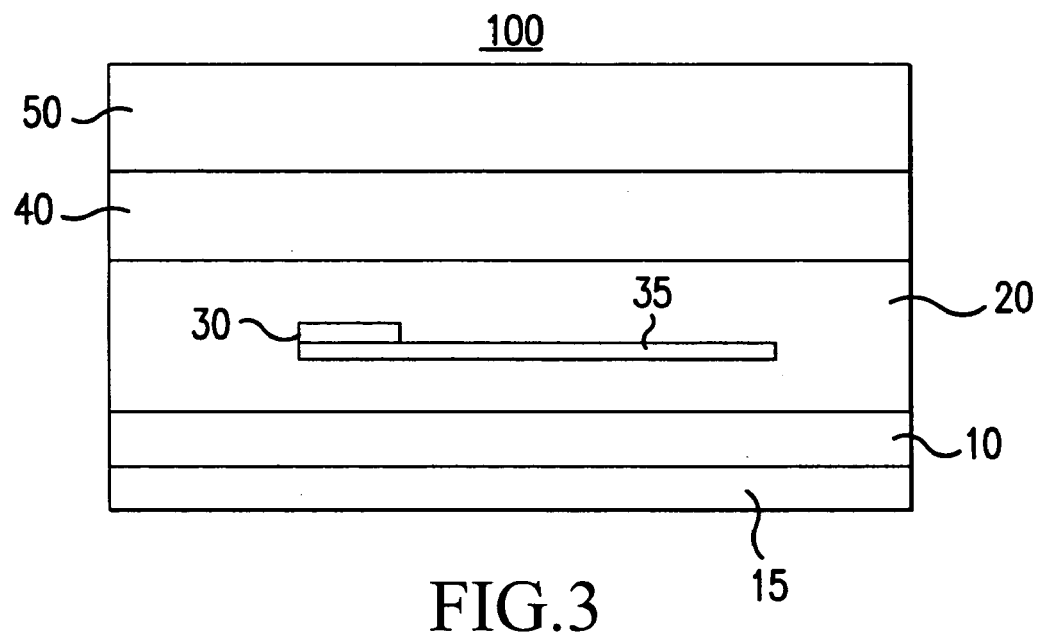
FIG. 3 is a sectional view of a thermal imaging laminate structure according to an embodiment of the present invention.
Figure 4:
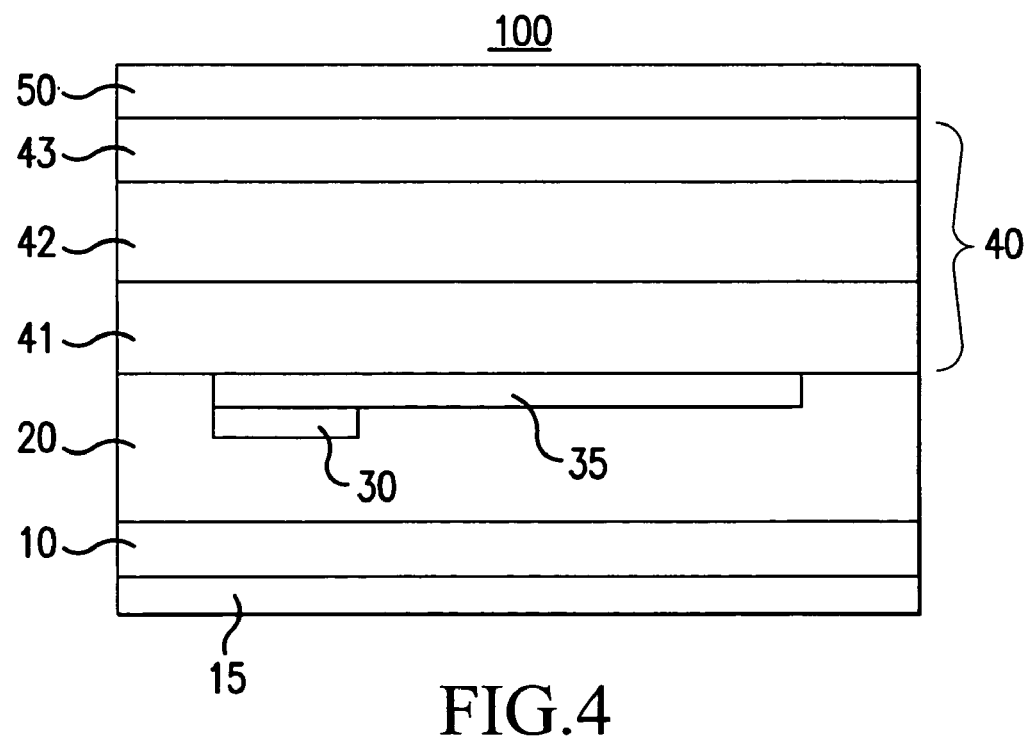
FIG. 4 is a sectional view of a thermal imaging laminate structure according to an embodiment of the present invention.
Figure 5:
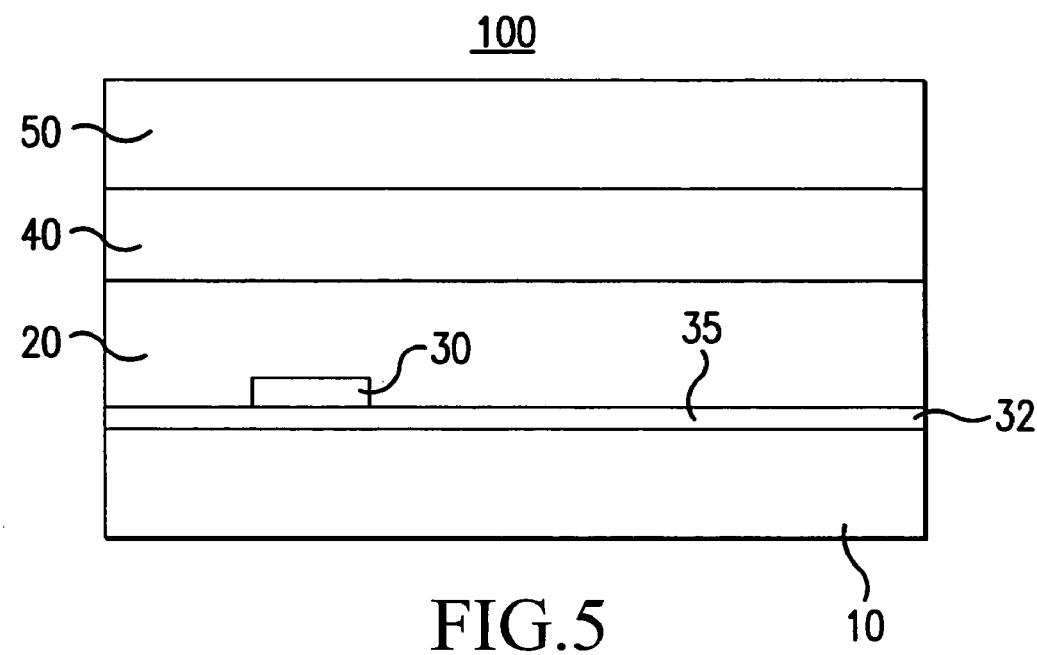
FIG. 5 is a sectional view of a thermal imaging laminate structure according to an embodiment of the present invention.
Figure 6:
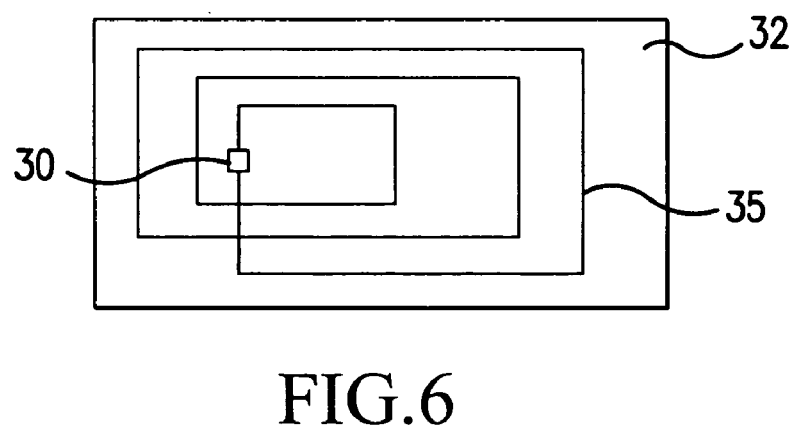
FIG. 6 is a top view of a wireless memory device according to an embodiment of the present invention.

The present invention will be described in greater detail hereinafter with reference to the accompanying drawings. FIG. 1 is a sectional view of a thermal imaging laminate structure, according to an embodiment of the present invention. FIG. 2 is a sectional view of a thermal imaging laminate structure according to an embodiment of the present invention. FIG. 3 is a sectional view of a thermal imaging laminate structure according to an embodiment of the present invention. FIG. 4 is a sectional view of a thermal imaging laminate structure according to an embodiment of the present invention. FIG. 5 is a sectional view of a thermal imaging laminate structure according to an embodiment of the present invention. FIG. 6 is a top view of a wireless memory device according to an embodiment of the present invention.

The present invention is directed toward a thermal imaging laminate structure, RFID product, a method of making the laminate structure, and a system employing the thermal imaging laminate with a security or wireless memory device. The thermal imaging laminate structure of the present invention is directed at a laminate structure that includes a thermal imaging heat sensitive layer 40, e.g., thermal papers such as OPTIMA® offered commercially through Appleton Papers. Thermal papers are increasingly used as facsimile paper, point of transaction, automated teller (ATM), pay-at-pump gas receipts and thermal label products, e.g., products sold to companies who apply pressure sensitive coating(s) and then distribute to label manufacturers. Thermal tag, ticket and chart grades of thermal papers are especially useful in specialty printing applications for conversion to finished products such as entertainment tickets, tags, coupons and medical charts.

Direct thermal and thermal transfer radio frequency identification (RFID) tags and labels are widely used in retail, inventory, security and other applications. The current construction of direct thermal and thermal transfer RFID tags and labels consists of a multi-layered laminate of a direct thermal imaging substrate made of paper, plastic or other material. Alternatively, a thermal transfer imaging substrate made of paper, plastic or other material as the first layer; an inlay which is an RFID circuit consisting of an integrated chip (IC), an antenna and an interposer to connect the chip to the antenna all mounted by adhesive onto a second substrate consisting of paper, plastic or other material as the second layer; a pressure sensitive adhesive or other adhesive device as the third layer; and a release liner as the fourth layer which can be peeled off the label leaving the glue or adhesive bare so that the tag or label can be affixed to the target application.

Figure 7:
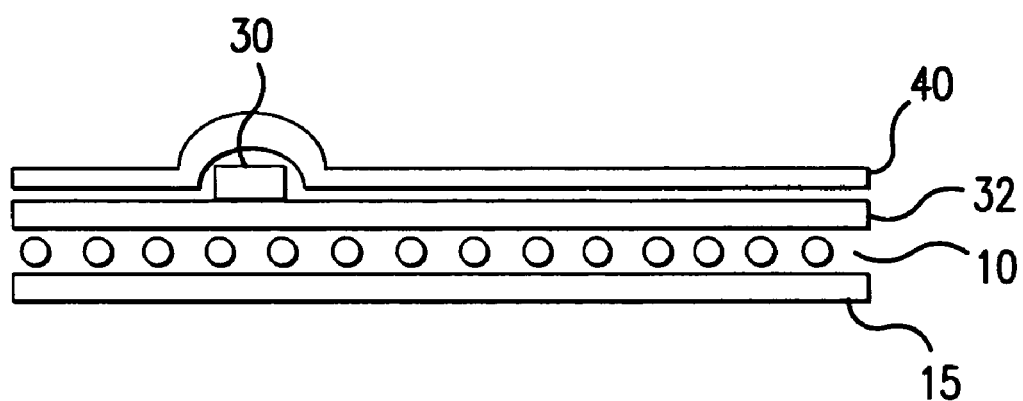
FIG. 7 is a sectional view of an exemplary label of the background art.

FIG. 7 is a sectional view of an exemplary label of the background art. Some of the disadvantages of the current RFID tag construction recognized by the present inventor are that there are no provisions to protect the IC substrate 32 and antenna assembly 35 from mechanical damage due to converting, printing and handling. There is also no protection against electronic damage from static electricity. Another problem is that the physical thickness of the IC substrate 32 and antenna 35 creates a bump on the printing surface of the top substrate 40. The bump causes broken images when printed with either a direct thermal or a thermal transfer printer. The bump also creates a high pressure point on the IC substrate 32 itself when it passes through a thermal printing nip between a platen roll and a thermal print head.

This can cause damage to both the chip 30 and the connection of the chip 30 to the antenna 35.

Direct thermal printing systems in general utilize a printing system where dots are selectively heated and cooled and dragged upon a heat-sensitive paper or substrate. The paper will turn dark in the areas specifically or selectively heated with precise measurements of heat by the thermal printing process and imaging device. A thermographic paper includes a label paper having a heat-activated coating that will accept an image from a thermal print head. Direct thermal papers are manufactured by coating papers with a special mixture of colorless dye, co-reactants and binders. When paper feeds through a thermal printer, heat from a thermal printer head causes dyes and co-reactants to activate and form an image. The image is created solely with a heated print head and the receiving medium, e.g. thermal paper.

Direct thermal paper products provide superior image quality, background whiteness and clarity, print contrast and character definition for direct thermal printing tasks, e.g. such as with OPTIMA® Thermal Paper products, and fast, reliable print operation. The quality and characteristics of the base paper and/or the application of the thermal coatings and their respective formulations is often performed with fully automated or computerized processes. Direct thermal papers can also be press printed, with flexographic, UV lithography and wet offset printing methods.

U.S. Pat. No. 5,821,196, the entirety of which is hereby incorporated by reference, discusses exemplary thermally-responsive record materials that are applicable to the thermal imaging technology of the present invention. Additional examples of other thermally-responsive record materials and systems well known in the art are further discussed in U.S. Pat. Nos. 3,539,375; 3,674,535; 3,746,675; 4,151,748; 4,181,771; 4,246,318; and 4,470,057, the entirety of each of which are hereby incorporated by reference.

Another form of thermal printing process involves a system referred to as thermal transfer. Thermal transfer printing systems operate similarly to direct thermal printing systems, with the exception that a single-use or intermediate ribbon is used and common paper is used as a substrate. Thermal transfer systems are often used in applications where problems of fading and/or changing colors would otherwise be problematic, such as in some direct thermal systems. However, thermal transfer systems do require the use of the ribbon material that involves a waste and/or recycling problem.

The thermal imaging laminate structure 100 of the present invention specifically incorporates any of the aforementioned thermal printing substrates, e.g. direct thermal, thermographic, thermal transfer paper, etc., as a thermal printing heat sensitive layer 40 within the laminate structure 100. One of skill in the art of thermal papers will appreciate that the actual makeup of the thermal printing heating sensitive layer 40 will vary according to the type of base paper, thermal coatings and end use that the thermal laminate structure 100 is intended to be applied and the particular thermal printing process of the laminate 100. In addition, the thermal printing heat sensitive layer 40 may be formed from a plurality of layers or from a single commercially available substrate, e.g. a roll of material selectively cut during the process of forming the laminate structure of the present invention.

FIG. 1 is a sectional view of a thermal imaging laminate structure according to an embodiment of the present invention. An antenna 35 and a microchip or integrated circuit 30 is provided within a thermal imaging laminate structure 100. In FIGS. 1 through 4, the integrated circuit 30 and antenna 35 are shown as an inlay microchip or card. However, it will be appreciated that this layer can also be formed by an IC substrate 32 (including an integral antenna 35) commonly available from commercial providers, e.g. as seen in FIG. 5 and FIG. 6. Additional examples of commercially available IC substrates 32 are further described in U.S. Pat. No. 6,147,604, the entirety of which is already incorporated by reference.

The antenna 35 and microchip or integrated circuit 30, (referred to hereinafter collectively as a "wireless memory device") would reflect radio signals to a detection unit (not shown) held or positioned in proximity to the thermal imaging laminate structure 100. As seen in FIG. 1, an embodiment of the present invention includes a pressure sensitive adhesive layer 10, a cushioning layer 20, a thermal imaging heat sensitive layer 40 and an antistatic coating 50. The wireless memory device is embedded within the polyfoam layer 20 shown in FIG. 1, e.g., the foam layer 20 is formed so as to surround and protectively encase the wireless memory device.

The integrated circuit 30 and antenna 35 are provided with the needed protection from physical damage and static electric discharge that is absent in the current products in the market. A flat printing surface for direct thermal and thermal transfer alpha numeric printing by eliminating the bump (as shown in FIG. 7 discussed above) caused by the integrated circuit 32 distorting the printing surface of the label or tag is also provided by the present invention. The cushioning layer 20 can actually include any soft plastic, polyfoam, polymer foam film, foam rubber, nonwoven material, or other soft, pliable cushioning material, preferably having caliper between 0.01 mm and 1.0 mm, and more particularly a caliper between 0.2 mm and 0.7 mm. In addition, a material with a nominal hardness, e.g., demonstrating suitable compressibility/durometer is preferable selected. The cushioning 20 layer, e.g., a polyfoam layer in a preferred embodiment, is placed between the direct thermal substrate 40 or the thermal transfer substrate 40 layer and the inlay 32 as shown in FIG. 1, or the inlay 32 can be placed between the cushioning layer 20 and the thermal imaging substrate 40 in an alternative embodiment.

The cushioning layer 20 absorbs the extra thickness of the integrated circuit assembly (30, 32, 35) and keeps it from creating the convex surface protrusion as shown in FIG. 7. Without the convex surface bump on the direct thermal or thermal transfer printing 40 surface, the required levelness of the printing surface is maintained throughout the printing process and an improved, flawless, image is obtained. The extra cushioning layer 20 between the integrated circuit assembly (30, 32, 35) and the outer surface of the label or tag provides extra protection against mechanical damage to the inlay antenna 35 connections and the integrated circuit 30, 32.

Static electricity protection is accomplished with the addition of the antistatic coating(s) 50 (shown in FIGS. 1 through 5) on either side of the direct thermal or thermal transfer substrate 40. These coatings can be from the family of quaternary ammonium salts, sodium chloride, potassium chloride, conductive polymers, doped polyanilides, powdered metal coatings, or their equivalents. The coatings can be applied to either or both surfaces of the thermal imaging substrate 40 at coating weights between 0.1 and 10 pounds per ream (3300 square feet). The antistatic coatings 50 can be used alone or in any combined mixture with other antistatic coatings. The antistatic coatings 50 or materials can also be added to any of the functional coatings used in the manufacture of the direct thermal substrate 40 or the thermal transfer substrate 40, e.g., between the integrated circuit assembly (30, 32, 35) and the cushioning layer 20. For example, the antistatic layer 50 can be a top or outermost coating of the laminate structure 100 when utilized as a direct thermal imaging product. Alternatively, for a thermal transfer imaging product, the antistatic coating 50 may be located on the underside of the thermal transfer sheet, e.g., between a thermal transfer sheet 40 and the cushioning layer 20.

An alternative way of providing antistatic properties to the direct thermal RFID or thermal transfer RFID label or tag, is the inclusion of antistatic materials directly in the manufacture of the cushioning layer 20 described hereinabove. Most of these antistatic treatments are proprietary to the commercial manufacturer of the cushioning material used and can be selected when selecting the cushioning material. Cushioning materials having antistatic properties specifically for the protection of the inlay circuits 30, 32, 35 and components described above in RFID direct thermal or thermal transfer tags and labels may include a combination (s) of antistatic coating(s) from the family of quaternary ammonium salts, sodium chloride, potassium chloride, conductive polymers, doped polyanilides, powdered metal coatings, or their equivalents and any of the aforementioned suitable materials for the cushioning layer 20.

The direct thermal RFID label or tag and the thermal transfer RFID label or tag of the present invention has the static dissipating ability to dissipate to 10% of full charge, a static charge of 5000 volts in less than 2 seconds after being conditioned in 20% relative humidity and 27 degrees centigrade for 24 hours. A design without the antistatic coatings of the claimed invention, conditioned under 20% relative humidity and 27 degrees centigrade for 24 hours, dissipated 5000 volts to 10% of full charge in greater than 12 seconds.

FIG. 2 is a sectional view of a thermal imaging laminate structure according to a second embodiment of the present invention. The cushioning layer 20 is formed so as to surround the wireless memory device 30, 35 in this embodiment. However, the wireless memory device 30, 35 is actually positioned adjacent to the thermal imaging heat sensitive layer 40, and with the antenna 35 positioned on an adhesive side of the inlay 30, 32, e.g., opposite to that shown in FIG. 1. Alternatively, the wireless memory device 30, 35 can be provided in the form of a substrate 32 whereby the IC substrate 32 extends the entire width of the section shown in FIG. 2. In this arrangement (not shown in FIG. 2), since the side of the IC substrate 32 closest to the thermal imaging substrate 40 would already present a smooth printing surface, e.g., no bumps, only the antenna 35 would actually be surrounded by the cushioning layer 20.

FIG. 3 is a sectional view of a thermal imaging laminate structure according to a third embodiment of the present invention. The embodiment shown in FIG. 3 is similar to the first embodiment shown in FIG. 1, with the exception of a release liner 15 provided to protect and maintain the adhesive properties of the pressure sensitive adhesive layer 10 until the thermal imaging laminate 100 is ready for application.

FIG. 4 is a sectional view of a thermal imaging laminate structure according to a fourth embodiment of the present invention. The embodiment shown in FIG. 4 is similar to the second embodiment of FIG. 2, e.g., the wireless memory device is positioned adjacent to the thermal imaging heat sensitive layer 40. As seen in FIG. 4, the heat imaging heat sensitive layer 40 can actually include any combination of layers of subcomponents, e.g., a heat imaging heat sensitive layer 40 for use as a thermal transfer paper or as a direct thermal imaging paper and/or a chip 30 and antenna 35 or an IC substrate 32 with an antenna 35.

In the example shown in FIG. 4, the thermal imaging heat sensitive layer 40 may include a paper stock layer 41, a thermal imaging component 42 such as flouran chromogens, and an acidic developer material 43 which upon melting or sublimation achieves reactive color-producing contact with the chromogenic material. Additional details of examples of these layers 41, 42, 43 are further discussed in U.S. Pat. No. 5,821,196, already incorporated by reference in its entirety. One of skill in the art will appreciate the number and sequence of these layers can be modified to satisfy a particular thermal imaging requirement.

FIG. 5 is a sectional view of a thermal imaging laminate structure according to a fifth embodiment of the present invention. In FIG. 5, the wireless memory device is not embedded in a cushioning layer 20. Instead, a pressure sensitive adhesive layer 10 and an IC substrate 32 having an integral antenna (see FIG. 6) is applied over the cushioning layer 20. In the embodiment shown, the wireless memory device 30, 35 is typically applied prior to the application of the adhesive layer 10.

A suitable pressure sensitive adhesive for the adhesive layer 10 is any acrylic pressure sensitive adhesive commonly used with a release liner 15. One of skill in the art will also appreciate that the pressure sensitive adhesive layer 20 can easily be replaced by other adhesives commonly available in the related art of adhesives, including but not limited to encapsulated adhesives that do not necessarily require a release liner 15 layer to protect the adhesive layer 10 during ordinary handling prior to installation or application. Instead, the use of an encapsulated adhesive permits the activation of the adhesive by a user or mechanical applicator through a preset or minimum pressure that would typically exceed pressures experienced during the ordinary handling of the laminate 100.

The cushioning layer 20 is a polyfoam layer 20 in a preferred embodiment. The cushioning layer 20 provides an intermediate layer between the adhesive and the wireless memory device 30, 35 that presents a smooth printing or application surface in contact with the thermal imaging heat sensitive layer 40. The relative resiliency of the polyfoam layer 20 permits the laminate 100 to conform to the shape of the wireless memory device 30, 35 and prevents errors in printing that might otherwise occur if the polyfoam layer 20 was not utilized, e.g. the printer head may skip over uneven portions of the thermal imaging heat sensitive layer 40 not corrected by the polyfoam layer 20.

One of skill in the art will appreciate that the polyfoam can be any of a variety of open or closed cell polyfoams, including but not limited to foam materials such as polyethylene, ethylene vinyl acetate, urethane, polyester, polyether, latex, silicone, urethane ethers, polypropylene, neoprene and poly-vinyl chloride. It will be appreciated that the flatness profile of the thermal imaging heat sensitive layer 40 will be optimized by the selection of a suitably resilient foam and a wireless memory device 30, 35 with a relatively flat and/or thin profile.

As aforementioned, the thermal imaging heat sensitive layer 40 can be any thermal paper and/or thermally coated substrate optimized for thermal printing processes such as direct thermal and thermal transfer printing processes, including but not limited to those examples further described in each of the U.S. patents incorporated by reference hereinabove.

The antistatic coating layer 50 can also be substituted or complemented with a protective topcoat or print receiving layer 50 designed to maintain the integrity of the thermal imaging heat sensitive layer 40, including but not limited to common topcoat or print receiving layers 50 made from polyvinyl alcohol.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a thermal printed paper product incorporating a security feature from a thermal imaging system including a thermal printing device; a heat sensitive, thermal imaging paper, said thermal imaging paper having a laminate structure including a thermal imaging paper substrate having a first surface and a second surface, said first surface being positioned to face toward said thermal printing device during a printing process, a cushioning layer, a wireless memory device capable of reflecting RE signals, said cushioning layer and said wireless memory device being disposed along said second surface of the thermal imaging paper_substrate, and an adhesive layer, said wireless memory device being positioned between said thermal imaging paper substrate and said adhesive layer; and a detection unit, said detection unit being positioned in the proximity of said wireless memory device to transmit and receive RF signals from said wireless memory device, said method comprising the steps of:

thermally printing said thermal imaging paper with said thermal printing device; and producing the thermal imaged paper product having said security feature, wherein said security feature includes said wireless device and said thermal imaged paper product includes at least one of a paper sheet, a roll of paper product, a label, and a tag.

2. A thermal printed paper product having a security feature produced by the process described in claim 1.

* * * * *